(12) United States Patent
Thiel et al.

(10) Patent No.: US 8,816,282 B2
(45) Date of Patent: Aug. 26, 2014

(54) MULTISPECTRAL SENSOR

(75) Inventors: Michael Thiel, Leonberg (DE); Ulrich Kallmann, Tuebingen (DE); Stefan Kundermann, Lausanne (CH); Eric Mottin, Saint-Martin-le-Vinous (FR); Agnes Arnaud, Saint-Jean-le-Vieux (FR)

(73) Assignees: Robert Bosch GmbH, Stuttgart (DE); CEA Commissariat a l'Energie Atomique et aux Energies Alternatives, Paris (FR)

( * ) Notice: Subject to any disclaimer, the term of this patent is extended or adjusted under 35 U.S.C. 154(b) by 270 days.

(21) Appl. No.: 12/989,436

(22) PCT Filed: May 29, 2009

(86) PCT No.: PCT/EP2009/056603
§ 371 (c)(1), (2), (4) Date: Apr. 29, 2011

(87) PCT Pub. No.: WO2009/147085
PCT Pub. Date: Dec. 10, 2009

(65) Prior Publication Data
US 2011/0194100 A1    Aug. 11, 2011

(30) Foreign Application Priority Data
Jun. 6, 2008 (DE) .......................... 10 2008 002 270

(51) Int. Cl.
*G01J 5/00* (2006.01)
(52) U.S. Cl.
USPC ..................................................... 250/338.1
(58) Field of Classification Search
USPC ............... 250/338.1–338.5, 339.01–339.09, 250/339.1, 339.11–339.15, 332, 250/370.01–370.15
See application file for complete search history.

(56) References Cited

U.S. PATENT DOCUMENTS

| 5,446,284 | A | 8/1995 | Butler et al. |
| 6,310,346 | B1 * | 10/2001 | Boreman et al. ........... 250/338.4 |
| 6,465,786 | B1 | 10/2002 | Rhodes |
| 7,095,027 | B1 * | 8/2006 | Boreman et al. ........... 250/338.4 |
| 7,501,636 | B1 * | 3/2009 | Son et al. .................. 250/370.14 |
| 7,705,309 | B1 * | 4/2010 | Jin et al. .................... 250/338.1 |
| 2004/0256561 | A1 * | 12/2004 | Beuhler et al. ........... 250/339.05 |

(Continued)

FOREIGN PATENT DOCUMENTS

| DE | 281104 | 8/1990 |
| WO | WO 2008/028512 | 3/2008 |

OTHER PUBLICATIONS

International Search Report, PCT International Patent Application No. PCT/EP2009/056603, dated Oct. 5, 2009.

(Continued)

*Primary Examiner* — David Porta
*Assistant Examiner* — Taeho Jo
(74) *Attorney, Agent, or Firm* — Kenyon & Kenyon LLP

(57) ABSTRACT

A multispectral sensor which includes a complementary metal oxide semiconductor substrate having a switching circuit, at least one antenna-receiving combination device for detecting terahertz radiation, at least one additional bolometer for detecting mid-range infrared radiation, and at least one diode for detecting radiation in the visible to near-infrared range. A multispectral imaging and/or spectroscopy system, a method for detecting and/or examining life forms, objects, and materials using such a system, and the use of such a sensor and system are also described.

20 Claims, 1 Drawing Sheet

(56) References Cited

U.S. PATENT DOCUMENTS

| | | |
|---|---|---|
| 2005/0087687 A1* | 4/2005 | Bluzer ............... 250/332 |
| 2005/0099345 A1* | 5/2005 | von Klitzing et al. ....... 343/703 |
| 2005/0122269 A1* | 6/2005 | Frazier ............... 343/703 |
| 2007/0171120 A1* | 7/2007 | Puscasu et al. ........... 342/53 |
| 2007/0263109 A1 | 11/2007 | Carlson et al. |
| 2008/0035847 A1* | 2/2008 | Honda et al. ........... 250/338.4 |
| 2008/0237468 A1* | 10/2008 | Honda et al. ........... 250/338.4 |
| 2009/0015491 A1* | 1/2009 | Ikeda et al. ............ 343/703 |
| 2009/0321644 A1 | 12/2009 | Vogt et al. |
| 2010/0276594 A1* | 11/2010 | Rafailov et al. ........... 250/338.4 |

OTHER PUBLICATIONS

Matyi G: "Nanoantennas for uncooled, double-band, CMOS compatible, high-speed infrared sensors" International Journal of Circuit Theory and Applications Wiley UK, Bd. 32, Nr. 5, May 10, 2004 pp. 425-430, XP002547369.

* cited by examiner

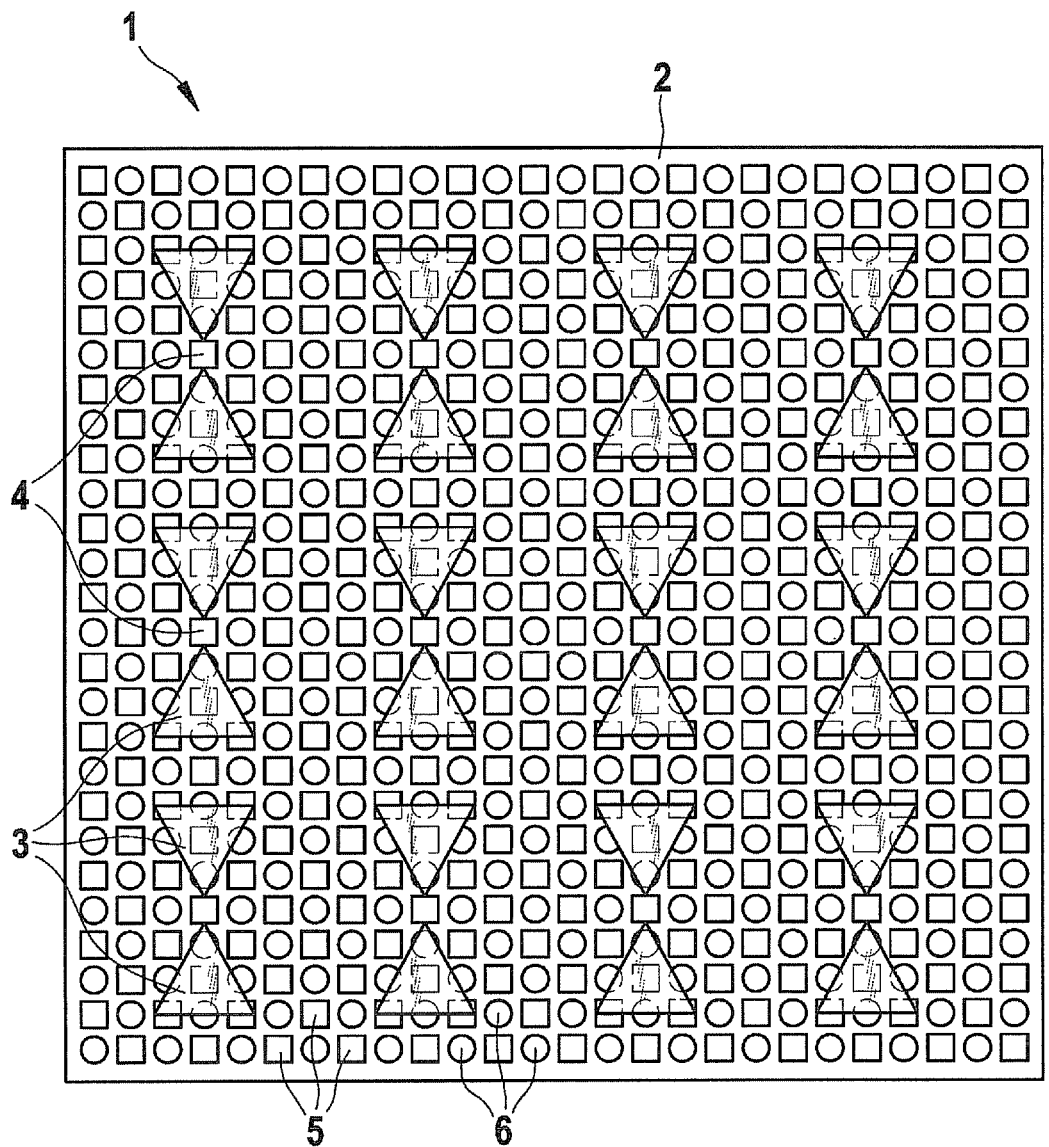

MULTISPECTRAL SENSOR

FIELD OF THE INVENTION

The present invention relates to a multispectral sensor for detecting terahertz radiation, infrared radiation, and radiation in the visible to near-infrared range, a multispectral imaging and/or spectroscopy system, a method for detecting and/or examining life forms, objects, and materials with the aid of such a system, and the use of such a sensor and system.

BACKGROUND INFORMATION

The electromagnetic spectrum in the range of the terahertz frequency band may provide information concerning the complex chemical composition of materials and the dielectric properties of objects. For this application, quite complex systems are currently used which contain pulsed laser sources, for example. Besides the complexity, a significant weakness of the available terahertz systems is that a measurement solely in the terahertz frequency band is not very meaningful, and often must be supplemented by simultaneous measurements in the visible or infrared frequency band. This is usually carried out by the simultaneous use of multiple detectors or detection systems which require a complex mutual optical alignment, which results in high costs for the overall system.

SUMMARY

An example multispectral sensor according to the present invention includes a complementary metal oxide semiconductor substrate having a switching circuit, at least one antenna-receiver means combination device for detecting terahertz radiation, at least one device for detecting mid-range infrared radiation, and at least one diode for detecting radiation in the visible to near-infrared range.

The example multispectral sensor may have the advantage on the one hand that all components of the sensor may be operated at room temperature. The example sensor 1 according to the present invention therefore does not require cooling, in particular cryoscopic cooling. On the other hand, example sensor 1 according to the present invention has the advantage that various functions may be combined on a single component on the sensor, so that a single sensor is advantageously sufficient for managing complex detection applications. In addition, the complicated adjustment of various sensors is advantageously dispensed with, and only a single broadband, preferably reflective, optical system is required. The example sensor according to the present invention also advantageously allows simultaneous, in the ideal case real time, detection of electromagnetic radiation in the visible to near-infrared, mid-range infrared, and terahertz range. Furthermore, the example sensors according to the present invention may be manufactured at low unit production costs over the long term, which also allows use in mass-produced products.

BRIEF DESCRIPTION OF THE DRAWING

Further advantages and advantageous embodiments of an example embodiment according to the present invention are illustrated by the FIGURE and explained in the description below. It is noted that the FIGURE has only a descriptive character, and is not intended to limit the present invention in any way.

FIG. 1 shows a top view of one specific embodiment of a multispectral sensor according to the present invention.

DETAILED DESCRIPTION OF EXAMPLE EMBODIMENTS

FIG. 1 shows an example sensor 1 according to the present invention including a complementary metal oxide semiconductor substrate 2 having a switching circuit, not illustrated. These types of substrates are typically also referred to as CMOS substrates. According to the example embodiment of the present invention, at least one antenna 3-receiver 4 combination device for detecting terahertz radiation, at least one device 5 for detecting mid-range infrared radiation, and at least one diode 6 for detecting radiation in the visible to near-infrared range are situated on CMOS substrate 2.

Within the scope of the present invention, the term "terahertz radiation" refers to electromagnetic radiation in a range of approximately ≥15 µm to approximately ≤1000 µm, the term "mid-range infrared radiation" refers to electromagnetic radiation in a range of approximately ≥1 µm to approximately ≤15 µm, and the term "radiation in the visible to near-infrared range" refers to electromagnetic radiation in a range of approximately ≥0.380 µm to approximately <1 µm.

The detection interval of sensor 1 according to the present invention may be in the terahertz range of >0.3 terahertz to terahertz as well as, for example, ≥0.3 terahertz or ≥0.5 terahertz or ≥1 terahertz to ≤3 terahertz or ≤5 terahertz or ≤10 terahertz. Similarly, the detection interval of sensor 1 according to the present invention may be in the terahertz range of ≥15 µm to <1000 µm as well as, for example, ≥30 µm or ≥60 µm or ≥100 µm to ≤300 µm or ≤600 µm or ≥1000 µm.

Likewise, the detection interval of sensor 1 according to the present invention in the mid-infrared range may be >20 terahertz to ≤300 terahertz as well as ≥21.4 terahertz to ≤37.5 terahertz or ≤60 terahertz or ≤100 terahertz.

Similarly, the detection interval of sensor 1 according to the present invention in the mid-infrared range may be ≥1 µm to approximately <15 µm as well as, for example, ≥3 µm to ≤5 µm, or ≥8 µm to ≤14 µm.

Similarly, the detection interval of sensor 1 according to the present invention in the visible to near-infrared range may be >300 terahertz to ≤790 terahertz.

Within the scope of the present invention, it is therefore not necessary for an antenna 3-receiver combination device 4 for detecting terahertz radiation, or a device 5 for detecting mid-range infrared radiation, or a diode 6 for detecting radiation in the visible to near-infrared range, to detect the complete radiation range in each case.

In one preferred specific embodiment of the present invention, sensor 1 according to the present invention has at least two different antenna 3-receiver combination devices 4 having different interspaced, contiguous, or overlapping detection frequency bands.

Subdividing the terahertz range into at least two, in particular narrowband, sub-bands has the advantage that narrowband antennas 3 may be better adapted, in particular linked, to receiver 4, thus allowing the sensitivity ("performance") of the overall system to be improved with a suitable configuration.

Sensor 1 according to the present invention therefore preferably has at least two different antenna 3-receiver 4 combination devices which are designed in such a way that the terahertz range is subdivided into at least two, in particular narrowband, sub-bands which are associated with antenna 3-receiver combination devices 4.

Sensor 1 according to the present invention may also have at least two different devices 5 for detecting mid-range infrared radiation having different interspaced, contiguous, or overlapping detection frequency bands.

Furthermore, sensor 1 according to the present invention may also have at least two different diodes 6 for detecting radiation in the visible to near-infrared range having different interspaced, contiguous, or overlapping detection frequency bands.

As shown in FIG. 1, a sensor 1 according to the present invention preferably has a plurality of, for example, identical and/or different (not illustrated) antenna-3-receiver combination devices 4, devices 5 for detecting mid-range infrared radiation, and diodes 6 for detecting radiation in the visible to near-infrared range.

Within the scope of the present invention, antenna-bolometer combination devices and/or antenna-diode combination devices, in particular antenna-bolometer, antenna-Schottky diode, and/or antenna-MIM diode combination devices, have proven to be particularly advantageous as antenna 3-receiver combination devices 4, since such combination devices do not require cooling, in particular cryoscopic cooling. Within the meaning of the present invention, an "MIM diode" is understood to mean a metal-insulator-metal diode. The variation in these different antenna 3-receiver combination devices 4 offers a possibility for providing different antenna 3-receiver combination devices 4 having different interspaced, contiguous, or overlapping detection frequency bands.

Within the scope of the present invention, an antenna 3-receiver combination device 4 has at least one antenna 3 which is connected, in particular capacitively connected, to receiver 4. However, antenna 3-receiver combination device 4 may also have at least two antennas 3 which are connected, in particular capacitively connected, to receiver 4. The number of antennas offers a further possibility for providing different antenna 3-receiver combination devices 4 having different interspaced, contiguous, or overlapping detection frequency bands.

When a bolometer is used as receiver 4, antenna 3 is used to absorb terahertz radiation which is converted to heat in the bolometer which is connected, in particular capacitively connected, to antenna 3, a resulting change in resistance of the bolometer being measured. The bolometer may be a microbolometer. Within the scope of the present invention, bolometer 4 may have a layered substrate which is approximately $\geq 25$ $\mu m^2$ to $\leq 4900$ $\mu m^2$, in particular 625 $\mu m^2$ to $\leq 2500$ $\mu m^2$, in size, and which is separated at a distance from CMOS substrate 2 via two electrically conductive supports. The layered substrate may have a polygonal, in particular rectangular and/or square, or also generally out-of-round, in particular ellipsoidal or circular, design. The layered substrate may include amorphous silicon or vanadium oxide. The layered substrate may be situated, for example, parallel to CMOS substrate 2. The design of the bolometer offers a further possibility for providing different antenna 3-receiver combination devices 4 having different interspaced, contiguous, or overlapping detection frequency bands.

When a diode 4, in particular a Schottky or MIM diode, is used as receiver 4, the terahertz signal received by antenna 3 is rectified, or, for a heterodyne reception approach, is mixed with a further terahertz signal to form an intermediate frequency signal. The design of the diode offers a further possibility for providing different antenna 3-receiver 4 combination devices having different interspaced, contiguous, or overlapping detection frequency bands.

Within the scope of the present invention multiple, in particular all, antennas 3 may be situated in one plane, as shown in FIG. 1. Likewise, within the scope of the present invention multiple, in particular all, devices 5 for detecting mid-range infrared radiation, or multiple, in particular all, diodes 6 for detecting radiation in the visible to near-infrared range may in each case be situated in one plane. As shown in FIG. 1, devices 5 for detecting mid-range infrared radiation and diodes 6 for detecting radiation in the visible to near-infrared range may be situated in a common plane.

Within the scope of one specific embodiment of the present invention, at least one antenna 3 or antennas 3 in the antenna plane is/are situated on the radiation side with respect to at least one device 5 for detecting mid-range infrared radiation and/or at least one diode 6 for detecting radiation in the visible to near-infrared range, in particular with respect to the plane of devices 5 for detecting mid-range infrared radiation and/or with respect to the plane of diodes 6 for detecting radiation in the visible to near-infrared range.

As the result of different antenna designs, antenna 3-receiver combination devices 4 having different absorption characteristics with regard to frequency and polarization in the terahertz band may be implemented. Different antenna designs offer another, in particular preferred, possibility for providing different antenna 3-receiver combination devices 4 having different interspaced, contiguous, or overlapping detection frequency bands.

An antenna 3 may have a planar design, as shown in FIG. 1, as well as a nonplanar design. For example, within the scope of the present invention an antenna 3 may have a polygonal, in particular rectangular and/or square, or also essentially out-of-round, in particular ellipsoidal or circular, or helical design.

Within the scope of one specific embodiment of the present invention, sensor 1 according to the present invention has at least two antenna 3-receiver combination devices 4 having different antenna designs. For example, multiple antenna designs may be combined, in particular in a selective manner, on a sensor 1 which result in multiple, for example interspaced, frequency bands in the terahertz range which are tuned specifically to frequency ranges to be detected, for example frequency ranges which are characteristic for explosives, thus providing a spectroscopy and/or frequency selection function for sensor 1 according to the present invention.

Within the scope of one preferred specific embodiment of the present invention, sensor 1 according to the present invention therefore has at least two different antenna 3-receiver combination devices 4 which, in particular as the result of different antenna designs, are tuned to specific/preferred frequency ranges to be detected in the terahertz range.

Within the scope of one preferred specific embodiment of the present invention, an antenna 3 includes a particularly thin metal layer and/or a semiconductor layer, and/or a layer composed of one or more electrically conductive polymers and/or a layer based on carbon nanotubes. In particular, an antenna 3 may be formed from a particularly thin metal layer or semiconductor layer, or a layer composed of one or more electrically conductive polymers or a layer based on carbon nanotubes. For example, the metal layer may be made of gold. The semiconductor layer may be formed from a wide band gap semiconductor, for example indium-tin oxide, zinc oxide, aluminum nitride, gallium nitride, and/or silicon carbide, in particular doped indium-tin oxide, zinc oxide, aluminum nitride, gallium nitride, and/or silicon carbide.

Within the scope of one particularly preferred specific embodiment of the present invention, the metal layer and/or semiconductor layer is transmissive to radiation in the visible to near-infrared range and/or the mid-infrared range. This has the advantage that one or more devices 5 for detecting mid-range infrared radiation and/or one or more diodes 6 for detecting radiation in the visible to near-infrared range may be situated beneath antenna(s) 3 of an antenna 3-receiver combination device 4. The term "beneath" is used to define the orientation not with respect to the gravitational direction, but rather with respect to the expected direction of radiation, and "beneath an antenna" is understood to mean the side of an antenna 3 facing away from radiation.

Within the scope of the specific embodiment shown in FIG. 1, numerous devices 5 for detecting mid-range infrared radiation and diodes 6 for detecting radiation in the visible to near-infrared range are situated beneath antennas 3, or between antennas 3 and complementary metal oxide semiconductor substrate 2. There is no galvanically conductive connection between antennas 3 and devices 5 for detecting mid-range infrared radiation or diodes 6 for detecting radiation in the visible to near-infrared range. The term "no galvanically conductive connection" means that there is no "direct" conduction via a metallic line, for example, which does not rule out capacitive and/or inductive "indirect" conduction. A galvanically conductive connection between antennas 3 and devices 5 for detecting mid-range infrared radiation or diodes 6 for detecting radiation in the visible to near-infrared range may be avoided, for example, by situating antennas 3 on one or more carriers (not illustrated), for example a carrier layer, composed in particular of one or more galvanically nonconductive polymers made of a galvanically nonconductive material.

Within the scope of the present invention, bolometers and/or MIM diodes may be used as a device 5 for detecting mid-range infrared radiation. The use of bolometers and MIM diodes thus offers a possibility for providing different devices 5 for detecting mid-range infrared radiation having different interspaced, contiguous, or overlapping detection frequency bands. When bolometers 5 are used as devices 5 for detecting mid-range infrared radiation, bolometers 5 as shown in FIG. 1 are preferably designed and configured in a freestanding manner.

For example, a bolometer having a layered substrate which is approximately $\geq 25$ $\mu m^2$ to $\leq 4900$ $\mu m^2$, in particular $\geq 625$ $\mu m^2$ to $\leq 2500$ $\mu m^2$, in size is suited as a device 5 for detecting mid-range infrared radiation. The layered substrate may be situated at a distance from CMOS substrate 2 in particular with the aid of two galvanically conductive supports. The layered substrate may have a polygonal, in particular rectangular and/or square, or also essentially out-of-round, in particular ellipsoidal or circular, design. The layered substrate may include amorphous silicon or vanadium oxide. The layered substrate is preferably situated parallel to CMOS substrate 2. The wavelength range of the radiation to be detected may advantageously be set using the distance between the layered substrate and CMOS substrate 2. For optimal detection, the distance preferably corresponds to one-fourth of the wavelength of the radiation to be detected. A change in the distance between the layered substrate and CMOS substrate 2 thus offers a further possibility for providing different devices 5 for detecting mid-range infrared radiation having different interspaced, contiguous, or overlapping detection frequency bands.

Suitable as diodes, for example, are diodes, in particular photodiodes, which are used in CMOS imaging detectors.

As shown in FIG. 1, sensor 1 according to the present invention, in particular a portion of sensor 1 according to the present invention, for example CMOS substrate 2, antenna 3-receiver combination device(s) 4, device(s) 5 for detecting mid-range infrared radiation, and diode(s) 6 for detecting radiation in the visible to near-infrared range, of sensor 1 advantageously have a monolithic design. The term "monolithic" means that units 2, 3, 4, 5, 6 of sensor 1 form a unit which in particular is indivisible. The sensor according to the present invention may in particular be a monolithically integrated chip.

Within the scope of the present invention, the switching circuit (not illustrated in FIG. 1), antenna 3-receiver combination devices 4, devices 5 for detecting mid-range infrared radiation, and diodes 6 for detecting radiation in the visible to near-infrared range are preferably designed and configured in such a way that antenna 3-receiver means 4 combination devices, devices 5 for detecting mid-range infrared radiation, and diodes 6 for detecting radiation in the visible to near-infrared range may be wired and/or read out, in particular independently of one another. For evaluating the read-out measuring results, sensor 1 according to the present invention preferably has an evaluation electronics system. In addition, the sensor preferably has a multispectral optical system, for example a reflective optical system based on mirrors. Such a multispectral optical system is advantageously provided on the radiation side with respect to components 3, 4, 5, 6 situated on CMOS substrate 2.

The evaluation electronics system and multispectral optical system may be, but do not have to be, integrated into the monolithic portion of sensor 1.

FIG. 1 shows that antenna 3-receiver combination devices 4, devices 5 for detecting mid-range infrared radiation, and diodes 6 for detecting radiation in the visible to near-infrared range may have a grid design. Accordingly, antenna 3-receiver combination devices 4, devices 5 for detecting mid-range infrared radiation, and diodes 6 for detecting radiation in the visible to near-infrared range may also be referred to as "pixels." Within the scope of one specific embodiment of the present invention, antenna 3-receiver combination devices 4, devices 5 for detecting mid-range infrared radiation, and diodes 6 for detecting radiation in the visible to near-infrared range are situated on sensor 1 as pixels in a grid of at least 20 by 20, for example at least 50 by 50, in particular at least 100 by 100 pixels. Antenna 3-receiver combination devices 4, devices 5 for detecting mid-range infrared radiation, and diodes 6 for detecting radiation in the visible to near-infrared range may be situated on sensor 1 in a symmetrical pattern. Antenna 3-receiver combination devices 4, devices 5 for detecting mid-range infrared radiation, and diodes 6 for detecting radiation in the visible to near-infrared range are preferably uniformly distributed on sensor 1, as shown in FIG. 1. In particular, devices 5 for detecting mid-range infrared radiation and diodes 6 for detecting radiation in the visible to near-infrared range may be provided in alternation. Within the scope of the present invention, the number of antenna 3-receiver combination devices 4 may be fewer than the number of devices 5 for detecting mid-range infrared radiation and the number of diodes 6 for detecting radiation in the visible to near-infrared range. Antenna 3-receiver combination devices 4 may then, for example, be uniformly spaced, as shown in FIG. 1, instead of a device 5 for detecting mid-range infrared radiation or a diode 6 for detecting radiation in the visible to near-infrared range in the otherwise alternating configuration of devices 5 for detecting mid-range infrared radiation and diodes 6 for detecting radiation in the visible to near-infrared range.

Within the scope of the present invention, the ratio of antenna 3-receiver combination devices 4 to devices 5 for detecting mid-range infrared radiation may be in a range of $\geq 1:100$ to $\leq 100:1$, for example 1:50 to $\leq 50:1$, in particular $\geq 1:30$ to $\leq 30:1$, and/or the ratio of antenna-3-receiver combination devices 4 to diodes 6 for detecting radiation in the visible to near-infrared range may be in a range of ≥1:100 to ≤100:1, for example ≥1:50 to ≤50:1, in particular ≥1:30 to ≤30:1, and/or the ratio of devices 5 for detecting mid-range infrared radiation to diodes 6 for detecting radiation in the visible to near-infrared range may be in a range of ≥1:50 to ≤50:1, for example ≥1:10 to ≤10:1, in particular ≥1:3 to ≤3:1. For example, the ratio of antenna 3-receiver combination devices 4 to devices 5 for detecting mid-range infrared radiation may be ≥1:5, for example ≥1:10, in particular ≥1:20, and/or the ratio of antenna 3-receiver combination devices 4 to diodes 6 may be ≥1:5, for example ≥1:10, in particular ≥1:20, and/or the ratio of devices 5 for detecting mid-range infrared radiation to diodes 6 for detecting radiation in the visible to near-infrared range may be approximately 1:1.

Moreover, the present invention relates to a multispectral imaging and/or spectroscopy system having a sensor 1 according to the present invention which is used as a detector, and a terahertz radiation source. Sensor 1 and the terahertz radiation source may be situated with respect to the object to be examined in such a way that sensor 1 detects the radiation remaining after the object is irradiated, and also in such a way that sensor 1 detects the radiation reflected and/or scattered by the object. As a result, the terahertz radiation source, sensor 1, and the object may be situated along an axis, the object being situated between the terahertz radiation source and the sensor, or also in such a way that they are not situated along an axis with respect to one another.

The system according to the present invention advantageously allows real-time spectroscopy in the terahertz range, as well as imaging detection in the terahertz range and in the infrared, visible, and near-infrared range.

Moreover, the present invention relates to a method for detecting and/or examining life forms, in particular humans and animals, and objects and materials, using a system according to the present invention. This method may be based in particular on frequency range spectroscopy. In the method according to the present invention, the terahertz radiation source preferably emits in a narrow terahertz band, for example having a width of approximately ≥20 gigahertz to approximately ≤200 gigahertz, in particular approximately ≥60 gigahertz to approximately ≤100 gigahertz, which is changed within a broad frequency range, for example in a range of approximately ≥0.3 terahertz to approximately ≤20 terahertz, for example ≥0.3 terahertz or ≥0.5 terahertz or ≥1 terahertz to ≤3 terahertz or ≤5 terahertz or ≤10 terahertz, the transmitted, reflected, and/or scattered radiation being detected, in particular measured, by sensor 1 according to the present invention. The measuring result of sensor 1 according to the present invention may be output by an output device, for example a display, a monitor, or a printer.

Moreover, the present invention relates to the use of a sensor 1 according to the present invention, a system according to the present invention, and/or a method according to the present invention in the fields of monitoring/security technology, transport, production, life science, and/or health. The present invention relates in particular to the use of a sensor 1 according to the present invention, a system according to the present invention, and/or a method according to the present invention for detecting and/or examining life forms, in particular humans and animals, and objects and materials, in particular explosives, for example for border security checks, in transit buildings such as airports and train stations, in transport means such as railways, buses, aircraft, and/or ships, and/or for major events, for burglary protection of buildings, rooms, and means of transport, for medical purposes, and/or for nondestructive testing, in particular of workpieces made of plastic.

What is claimed is:

1. A multispectral sensor, comprising:
   a complementary metal oxide semiconductor substrate having a switching circuit;
   at least one antenna receiver combination device to detect terahertz radiation;
   at least one device to detect mid-range infrared radiation; and
   at least one diode to detect radiation in a visible to near-infrared range;
   wherein the at least one device to detect mid-range infrared radiation and the at least one diode are situated beneath an antenna of the at least one antenna receiver combination device with no galvanic conductive connection between the at least one antenna receiver combination device and the at least one device to detect mid-range infrared radiation, and with no galvanic conductive connection between the at least one antenna receiver combination device and the at least one diode.

2. The sensor as recited in claim 1, wherein the antenna receiver combination device is one of an antenna-bolometer combination device or an antenna-diode combination device, and the device to detect mid-range infrared radiation is one of a bolometer or a metal-insulator-metal diode.

3. The sensor as recited in claim 2, wherein the antenna receiver combination device is at least one of an antenna-bolometer, antenna-Schottky diode, and an antenna-metal-insulator-metal diode combination device.

4. The sensor as recited in claim 1, wherein the sensor includes at least two different antenna receiver combination devices having one of different interspaced, contiguous, or overlapping detection frequency bands, and at least two different devices to detect mid-range infrared radiation having one of different interspaced, contiguous, or overlapping detection frequency bands, and at least two different diodes to detect radiation in the visible to near-infrared range having one of different interspaced, contiguous, or overlapping detection frequency bands.

5. The sensor as recited in claim 1, wherein the sensor includes at least two different antenna receiver combination devices which are designed in such a way that the terahertz range is subdivided into at least two sub-bands which are associated with the antenna receiver combination devices.

6. The sensor as recited in claim 1, wherein the sensor includes at least two antenna receiver combination devices having different antenna designs.

7. The sensor as recited in claim 1, wherein the sensor includes at least two different antenna receiver combination devices which are tuned to frequency ranges in the terahertz range to be detected.

8. The sensor as recited in claim 1, wherein the sensor has a plurality of antenna receiver combination devices, devices to detect mid-range infrared radiation, and diodes to detect radiation in the visible to near-infrared range, the antenna receiver combination devices, devices to detect mid-range infrared radiation, and diodes to detect radiation in the visible to near-infrared range having a grid design.

9. The sensor as recited in claim 8, wherein the antenna receiver combination devices, devices to detect mid-range infrared radiation, and diodes to detect radiation in the visible to near-infrared range are situated on the sensor as pixels in a grid of at least 20 by 20.

10. The sensor as recited in claim 9, wherein the grid is of at least 50 by 50.

11. The sensor as recited in claim 9, wherein the grid is of at least 100 by 100.

12. The sensor as recited in claim 8, wherein the antenna receiver combination devices, devices to detect mid-range infrared radiation, and diodes to detect radiation in the visible to near-infrared range are situated on the sensor in a symmetrical pattern.

13. The sensor as recited in claim 1, wherein the antenna receiver combination device includes at least one of a metal layer, a semiconductor layer, a layer composed of one or more electrically conductive polymers, a layer based on carbon nanotubes which is transmissive to radiation in the visible to near-infrared range, and a layer based on carbon nanotubes which is transmissive to infrared radiation.

14. The sensor as recited in claim 1, wherein an antenna of the antenna receiver combination device is situated on a carrier composed of a galvanically nonconductive material.

15. The sensor as recited in claim 1, wherein the sensor has a multispectral optical system.

16. The sensor as recited in claim 1, wherein the sensor has a reflective optical system.

17. The sensor as recited in claim 1, wherein the sensor has an evaluation electronics system.

18. A multispectral imaging system, comprising:
a sensor, including a complementary metal oxide semiconductor substrate having a switching circuit, at least one antenna receiver combination device to detect terahertz radiation, at least one device to detect mid-range infrared radiation, at least one diode to detect radiation in a visible to near-infrared range; and
a terahertz radiation source;
wherein the at least one device to detect mid-range infrared radiation and the at least one diode are situated beneath an antenna of the at least one antenna receiver combination device with no galvanic conductive connection between the at least one antenna receiver combination device and the at least one device to detect mid-range infrared radiation, and with no galvanic conductive connection between the at least one antenna receiver combination device and the at least one diode.

19. A spectroscopy system comprising:
a sensor, including a complementary metal oxide semiconductor substrate having a switching circuit, at least one antenna receiver combination device to detect terahertz radiation, at least one device to detect mid-range infrared radiation, at least one diode to detect radiation in a visible to near-infrared range; and
a terahertz radiation source;
wherein the at least one device to detect mid-range infrared radiation and the at least one diode are situated beneath an antenna of the at least one antenna receiver combination device with no galvanic conductive connection between the at least one antenna receiver combination device and the at least one device to detect mid-range infrared radiation, and with no galvanic conductive connection between the at least one antenna receiver combination device and the at least one diode.

20. A method for examining life forms, comprising:
emitting, by a terahertz radiation source, a narrow terahertz band which is changed within a broad frequency range; and
detecting by a sensor, at least one of transmitted, reflected and scattered radiation, the sensor including a complementary metal oxide semiconductor substrate having a switching circuit, at least one antenna receiver combination device to detect terahertz radiation, at least one device to detect mid-range infrared radiation, and at least one diode to detect radiation in a visible to near-infrared range;
wherein the at least one device to detect mid-range infrared radiation and the at least one diode are situated beneath an antenna of the at least one antenna receiver combination device with no galvanic conductive connection between the at least one antenna receiver combination device and the at least one device to detect mid-range infrared radiation, and with no galvanic conductive connection between the at least one antenna receiver combination device and the at least one diode.

* * * * *